(12) United States Patent
Choi et al.

(10) Patent No.: US 9,035,861 B2
(45) Date of Patent: *May 19, 2015

(54) GATE-ON VOLTAGE GENERATOR, DRIVING DEVICE AND DISPLAY APPARATUS COMPRISING THE SAME

(71) Applicant: SAMSUNG DISPLAY CO., LTD., Yongin, Gyeonggi-Do (KR)

(72) Inventors: Yun-Seok Choi, Asan-Si (KR); Yong-Soon Lee, Cheonan-Si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/176,872

(22) Filed: Feb. 10, 2014

(65) Prior Publication Data

US 2014/0176624 A1    Jun. 26, 2014

Related U.S. Application Data

(62) Division of application No. 11/763,123, filed on Jun. 14, 2007, now Pat. No. 8,692,751.

(30) Foreign Application Priority Data

Jul. 13, 2006 (KR) .......................... 10-2006-0066012
Apr. 19, 2007 (KR) .......................... 10-2007-0038497

(51) Int. Cl.
G09G 3/36      (2006.01)
H03K 5/13      (2014.01)
H02M 3/07      (2006.01)

(52) U.S. Cl.
CPC ................ *H03K 5/13* (2013.01); *G09G 3/3677* (2013.01); *G09G 3/3696* (2013.01); *G09G 2320/041* (2013.01); *H02M 3/07* (2013.01); *G09G 3/3607* (2013.01)

(58) Field of Classification Search
USPC ...................................................... 345/690, 87
See application file for complete search history.

(56) References Cited

U.S. PATENT DOCUMENTS 4,197,442 A    4/1980    Carlsson et al.
4,555,675 A    11/1985   Blanchandin et al.
(Continued)

FOREIGN PATENT DOCUMENTS

EP       0116492       8/1987
JP       2001-169273   6/2001
(Continued)

OTHER PUBLICATIONS

Search Report issued by the European Patent Office on May 29, 2009 during the examination of the corresponding European Patent Application No. 07012429.2

(Continued)

*Primary Examiner* — Fred Tzeng
(74) *Attorney, Agent, or Firm* — F. Chau & Associates, LLC (57) ABSTRACT

A gate-on voltage generator that can enhance display quality at low temperatures, a driving device, and a display apparatus having the same, in which the gate-on voltage generator includes a temperature sensor having an operational amplifier configured to receive a driving voltage and produce a temperature-dependent variable voltage, the level of which varies according to the ambient temperature, and a charge pumping unit shifting the temperature-dependent variable voltage by the voltage level of a pulse signal and generating a gate-on voltage.

21 Claims, 9 Drawing Sheets

(56) References Cited

U.S. PATENT DOCUMENTS

| | | |
|---|---|---|
| 6,166,726 A | 12/2000 | Uchida et al. |
| 6,333,728 B1 | 12/2001 | Libsch et al. |
| 7,262,752 B2 | 8/2007 | Weindorf |
| 7,825,889 B2 | 11/2010 | Kim et al. |
| 8,692,751 B2 * | 4/2014 | Choi et al. .................. 345/87 |
| 2005/0184946 A1 | 8/2005 | Pyoun et al. |
| 2005/0231496 A1 | 10/2005 | Kim et al. |

FOREIGN PATENT DOCUMENTS

| | | |
|---|---|---|
| JP | 2005-234580 | 9/2005 |
| KR | 10-1998-048655 | 9/1998 |
| KR | 10-2005-0045094 | 5/2005 |
| KR | 10-2005-0083003 A | 6/2005 |
| KR | 10-2005-0101059 | 10/2005 |

OTHER PUBLICATIONS

European Search Report dated Feb. 24, 2011 for Application No. 07-012-429.2-2205.
English Abstract for Publication No. 2001-169273.
Japanese Office Action dated Apr. 23, 2013.
Japanese Office Action dated Apr. 10, 2012.
English Abstract Publication No. 2005-234580.
Korean Notice of Allowance Dated Jan. 29, 2014.
Chinese Office Action Dated Mar. 22, 2011.

* cited by examiner

GATE-ON VOLTAGE GENERATOR, DRIVING DEVICE AND DISPLAY APPARATUS COMPRISING THE SAME

CROSS-REFERENCE TO RELATED APPLICATIONS

This application is a Divisional Application of U.S. patent application Ser. No. 11/763,123 filed on Jun. 14, 2007, which claims priority from Korean Patent Application No. 10-2006-0066012 filed on Jul. 13, 2006 and Korean Patent Application No. 10-2007-0038497 filed on Apr. 19, 2007 in the Korean Intellectual Property Office, the disclosures of each of which are incorporated herein by reference in their entirety.

BACKGROUND OF THE INVENTION

1. Technical Field

The present disclosure relates to a gate-on voltage generator, a driving device, and a display apparatus having the same.

2. Discussion of the Related Art

Generally, liquid crystal displays include a liquid display panel having a plurality of gate lines and a plurality of data lines, a gate driver providing gate driving signals to the plurality of gate lines, and a data driver providing data signals to the plurality of data lines. To achieve miniaturization and increased manufacturability, a structure in which a gate driver having a plurality of gate driving ICs is integrated on a predetermined area of a liquid crystal panel has recently been developed.

A gate driver formed on a liquid crystal panel includes at least one stage having a plurality of thin film transistors (TFTs). The driving capacity of the TFTs varies depending upon the ambient temperature. That is, if the ambient temperature is lowered, the current driving capacity of the TFTs of a gate driver is reduced, such that the voltage level of the output gate-on voltage is not sufficient enough to drive the TFTs in a pixel array. As a result, the display quality of the liquid crystal display may deteriorate.

Accordingly, there is a need to provide a gate-on voltage generator that can enhance the display quality at low temperatures, a driving device, and a display apparatus having the same.

SUMMARY OF THE INVENTION

Exemplary embodiments of the present invention provide a gate-on voltage generator that can enhance a display quality at low temperatures.

Exemplary embodiments of the present invention provide a driving device that can enhance a display quality at low temperatures.

Exemplary embodiments of the present invention provide a display apparatus having the driving device that can enhance a display quality at low temperatures.

These and other objects of the present invention will be described in or be apparent from the following description of the exemplary embodiments.

According to an exemplary embodiment of the present invention, there is provided a gate-on voltage generator including a temperature sensor having an operational amplifier configured to receive a driving voltage and produce a temperature-dependent variable voltage, the level of which varies according to the ambient temperature; and a charge pumping unit shifting the temperature-dependent variable voltage by the amplitude of a pulse signal and generating a gate-on voltage.

According to an exemplary embodiment of the present invention, there is provided a driving device including a boost converter that receives and boosts a first input voltage and outputs a pulse signal, where the driving voltage and an amplitude of the pulse signal are not influenced by an ambient temperature; a gate-on voltage generator including a temperature sensor including an operational amplifier configured to receive a driving voltage and produce a temperature-dependent variable voltage, the level of which varies according to the ambient temperature, and a charge pumping unit shifting the temperature-dependent variable voltage by the voltage level of a pulse signal and generating a gate-on voltage; a gate-off voltage generator shifting the voltage level of a second input voltage by the voltage level of the pulse signal and generating a gate-off voltage; and a switching unit generating a clock signal having a swing of a predetermined voltage difference between the gate-on voltage and the gate-off voltage.

According to another exemplary embodiment of the present invention, there is provided a driving device, including a boost converter, a gate-on voltage generator, a gate-off voltage generator, and a switching unit. The boost converter receives and boosts a first input voltage and outputs a driving voltage and a pulse signal, where the driving voltage and an amplitude of the pulse signal are not influenced by an ambient temperature. The gate-on voltage generator includes a first temperature sensor that outputs a first temperature-dependent variable voltage and a first charge-pumping unit that shifts the first temperature-dependent variable voltage by the amplitude of the pulse signal and outputs a gate-on voltage, where the first temperature-dependent variable voltage varies in inverse proportion to the ambient temperature. The gate-off voltage generator includes a second temperature sensor that outputs a second temperature-dependent variable voltage and a second charge-pumping unit that shifts the second temperature-dependent variable voltage by the amplitude of the pulse signal and outputs a gate-off voltage, where the second temperature-dependent variable voltage varies in proportion to the ambient temperature. The switching unit outputs a clock signal that swings between the gate-on voltage and the gate-off voltage.

According to an exemplary embodiment of the present invention, there is provided a display apparatus including a driving device that includes a boost converter that receives and boosts a first input voltage and outputs a pulse signal, where the driving voltage and an amplitude of the pulse signal are not influenced by an ambient temperature, a gate-on voltage generator having a temperature sensor receiving a driving voltage and producing a temperature-dependent variable voltage, the level of which varies according to the ambient temperature, and a charge pumping unit shifting the temperature-dependent variable voltage by the amplitude of a pulse signal and generating a gate-on voltage; a gate-off voltage generator shifting the voltage level of a second input voltage by the amplitude of the pulse signal and generating a gate-off voltage, and a switching unit generating a clock signal having a swing of a predetermined voltage difference between the gate-on voltage and the gate-off voltage; a gate driver receiving the clock signal and outputting the gate driving signals each having an amplitude increasing when the ambient temperature rises and decreasing when the ambient temperature falls; a data driver providing gray voltages corresponding to image data; and a display panel displaying images corresponding to the gray voltages responsive to the gate driving signals.

BRIEF DESCRIPTION OF THE DRAWINGS

Exemplary embodiments of the present invention will be understood in more detail from the following descriptions taken in conjunction with the attached drawings, in which.

DETAILED DESCRIPTION OF THE EXEMPLARY EMBODIMENTS

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims. Like reference numerals refer to like elements throughout the specification and drawings.

For brevity, the display apparatus according to exemplary embodiments of the present invention will now be described with regard to an LCD by way of example, but the present invention is not limited thereto.

Figure 1:
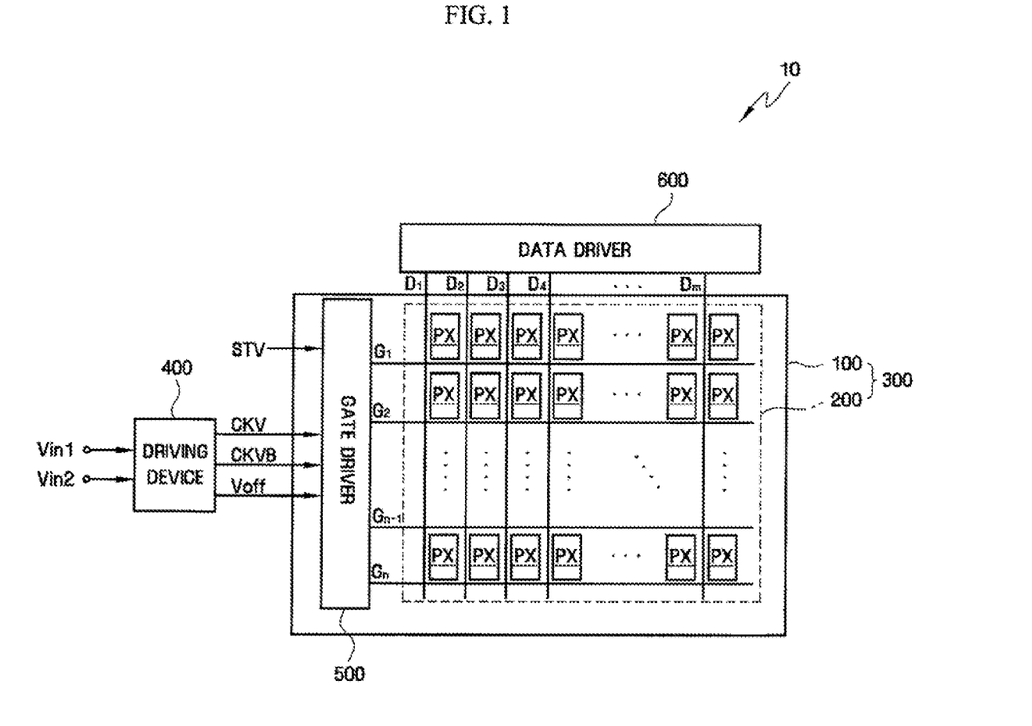
FIG. 1 is a block diagram of a liquid crystal display according to an exemplary embodiment of the present invention.
Figure 2:
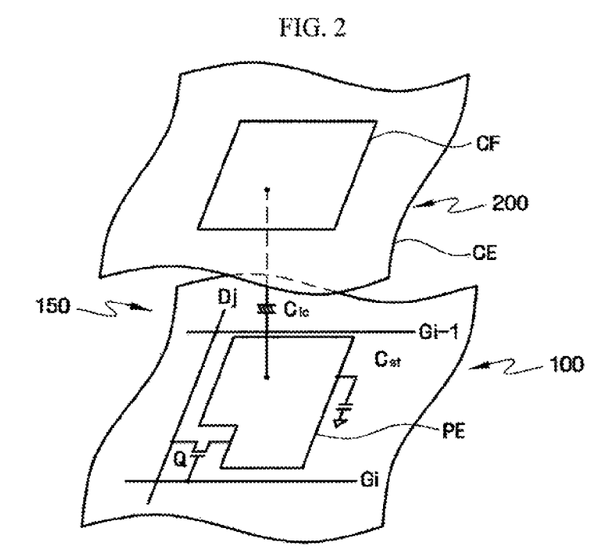
FIG. 2 is an equivalent circuit diagram of a pixel in a liquid crystal display according to an exemplary embodiment of the present invention.
Figure 3:
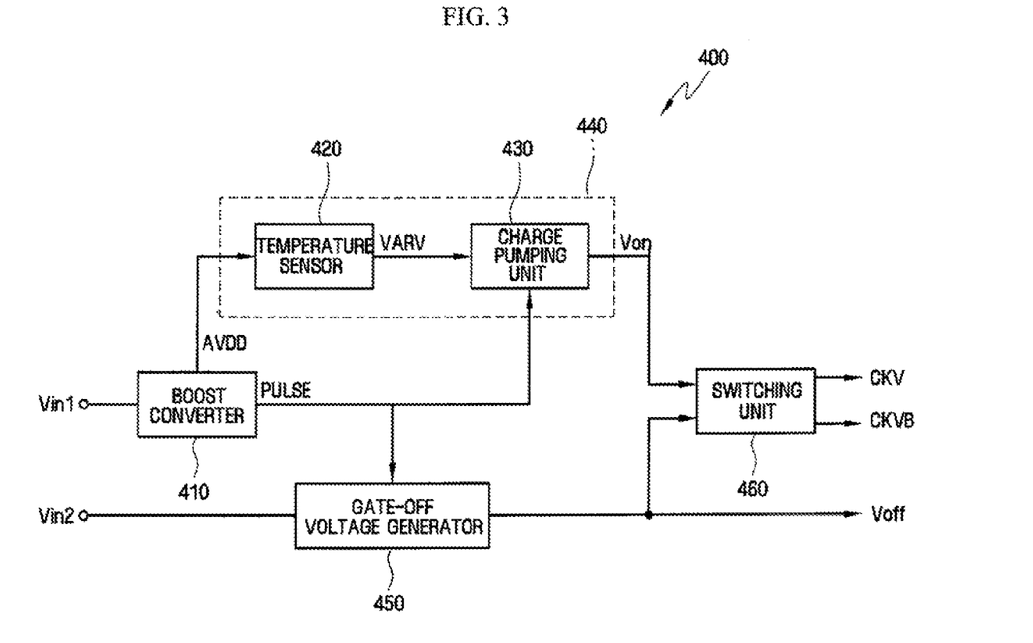
FIG. 3 is a block diagram of a driving device according to an exemplary embodiment of the present invention.

FIG. 1 is a block diagram of a liquid crystal display 10 according to an exemplary embodiment of the present invention and FIG. 2 is an equivalent circuit diagram of a pixel in a liquid crystal display according to an exemplary embodiment of the present invention and FIG. 3 is a block diagram of a driving device according to an exemplary embodiment of the present invention.

Referring to FIG. 1, the liquid crystal display 10 according to an exemplary embodiment of the present invention includes a liquid crystal panel 300, a gate driver 500, a data driver 600, and a driving device 400.

The liquid crystal panel 300 includes a first plate having a plurality of gate lines $G_1$-$G_n$, a plurality of data lines $D_1$-$D_m$, a switching element (not shown), and a pixel electrode (not shown), and a second plate having a color filter (not shown) and a common electrode (CE) (not shown). The first plate 100 extends to be somewhat wider than the second plate 200.

The gate lines $G_1$-$G_n$ extend substantially in a row direction and parallel to each other, while the data lines $D_1$-$D_m$ extend substantially in a column direction and parallel to each other.

Referring to FIG. 2, a color filter (CF) may be formed on a predetermined area of a common electrode (CE) provided on the second plate 200 so as to face a pixel electrode (PE) provided on the first plate 100. For example, a pixel PX includes a switching element Q connected to signal lines $G_i$ and $D_j$, a liquid crystal capacitor $C_{lc}$ and a storage capacitor $C_{st}$ that are connected to the pixel. The storage capacitor $C_{st}$ may be omitted if desired. The switching element Q is a TFT made of amorphous silicon (a-Si).

The gate driver 500 of FIG. 1 is mounted on the extended region of the first plate 100. The gate driver 500 receives a clock signal CKV, a clock-bar signal CKVB, and a gate-off voltage Voff from the driving device 400, receives a vertical start signal STV indicating a vertical scanning start from a timing controller (not shown), and provides gate driving signals to the plurality of gate lines $G_1$-$G_n$.

The data driver 600 is connected to the plurality of data lines $D_1$-$D_n$ and provides data signals to the plurality of data lines $D_1$-$D_n$.

The driving device 400 receives a first input voltage Vin1 and a second input voltage Vin2 from an external circuit (not shown) and provides the clock signal CKV, the clock-bar signal CKVB, and the gate-off voltage Voff to the gate driver 500. The clock signal CKV, the clock-bar signal CKVB, and the gate-off voltage Voff are signals for controlling on/off states of the plurality of gate lines $G_1$-$G_n$. Unlike what is shown in FIG. 1, however, the driving device 400 may be configured to provide only the clock signal CKV to the gate driver 500. In this case, the gate driver 500 converts the clock signal CKV into a clock bar signal CKVB for driving the plurality of gate lines $G_1$-$G_n$.

The driving device 400 according to an exemplary embodiment of the present invention includes a boost converter 410, a gate-on voltage generator 440, a gate-off voltage generator 450, and a switching unit 460, as shown in FIG. 3.

The boost converter 410 receives and boosts the first input voltage Vin1 and generates a driving voltage AVDD and a pulse signal PULSE. The boost converter 410 may be a DC-DC converter or another kind of converter. The boost converter 410 will later be described with reference to FIG. 7.

The gate-on voltage generator 440 receives the driving voltage AVDD and the pulse signal PULSE from the boost converter 410 and generates a gate-on voltage Von. The level of the gate-on voltage Von is adjusted according to the ambient temperature.

More specifically, the gate-on voltage generator 440 includes a temperature sensor 420 and a charge pumping unit 430. The temperature sensor 420 produces a temperature-dependent variable voltage VARV, the level of which increases when the ambient temperature rises and vice versa. The charge pumping unit 430 receives the temperature-dependent variable voltage AVDD and the pulse signal PULSE, level-shifts the variable voltage VARV by the amplitude of the pulse signal PULSE, and generates the gate-on voltage Von. More specifically, when the ambient temperature decreases, the gate-on voltage generator 440 generates a gate-on voltage Von having an increased voltage level. On the contrary, when the ambient temperature increases, the gate-on voltage generator 440 generates a gate-on voltage Von having a decreased voltage level. The temperature sensor 420 and the charge pumping unit 430 will be described below in more detail with reference to FIGS. 4 and 5, respectively.

The gate-off voltage generator 450 receives the second input voltage Vin2 and the pulse signal PULSE from the boost converter 410 and generates a gate-off voltage Voff. The gate-off voltage Voff is maintained at a fixed value regardless of the ambient temperature. The gate-off voltage generator 450 will later be described in more detail with reference to FIG. 5.

The switching unit 460 generates a clock signal CKV and a clock bar signal CKVB swinging between the gate-on voltage Von and the gate-off voltage Voff. That is to say, a high level of the clock signal CKV corresponds to the voltage level of the gate-on voltage Von and a low level of the clock signal CKV corresponds to the voltage level of the gate-off voltage Voff. The clock signal CKV has a phase different from that of the clock bar signal CKVB. For example, the clock signal CKV and the clock bar signal CKVB have phases opposite to each other.

Here, the switching unit 460 receives control signals from a timing controller (not shown) and performs a switching operation between the two output signals CKV and CKVB.

Therefore, when the ambient temperature decreases, the driving device 400 outputs a clock signal CKV having an increased amplitude and a clock bar signal CKVB corresponding thereto of a different phase. On the contrary, when the ambient temperature increases, the driving device 400 outputs a clock signal CKV having a decreased amplitude and a clock bar signal CKVB corresponding thereto having a different phase. The amplitudes of the clock signal CKV and the clock bar signal CKVB are adjusted according to a variation of the voltage level of Von depending on a change in the ambient temperature.

Figure 4:
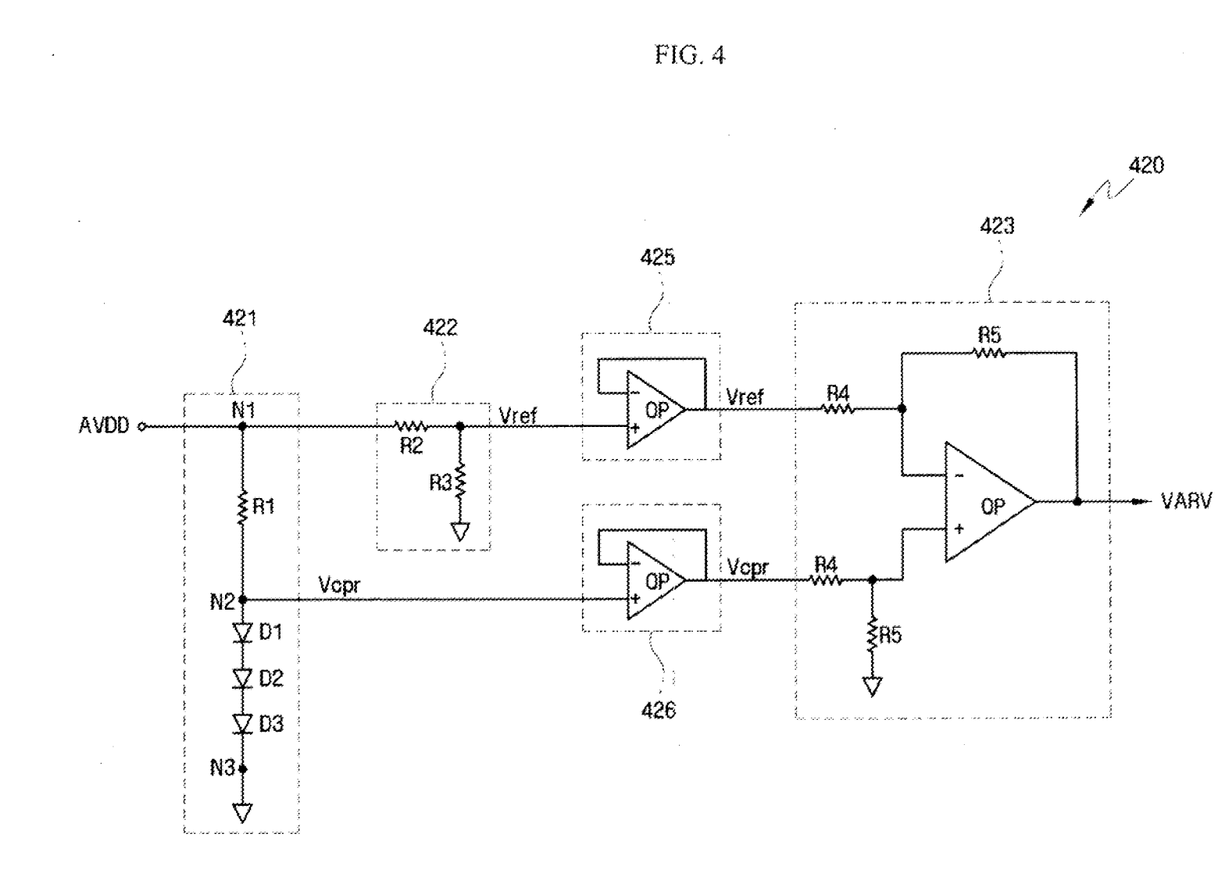
FIG. 4 is an internal circuit diagram illustrating a temperature sensor used in the device shown in FIG. 3.

FIG. 4 is a circuit diagram illustrating a temperature sensor (420) shown in FIG. 3.

Referring to FIG. 4, the temperature sensor 420 includes a comparison voltage generator 421 shifting the voltage level of the driving voltage AVDD according to the ambient temperature and generating a comparison voltage Vcpr, a reference voltage generator 422 dividing the driving voltage AVDD and generating a reference voltage Vref, and an amplifier 423 amplifying a difference between the comparison voltage Vcpr and the reference voltage Vref.

The comparison voltage generator 421 includes one or more diodes D1, D2, and D3 each having a variable threshold voltage. For example the threshold voltage of diodes D1, D2, and D3 is substantially inversely proportional to a change in the ambient temperature. More specifically, the comparison voltage generator 421 includes a fixed resistor R1 that is connected between a first node N1 and a second node N2 and one or more diodes D1, D2, and D3 that are connected between the second node N2 and a third node N3. The driving voltage AVDD, which is a positive voltage, is applied to the first node N1, and the comparison voltage Vcpr is output via the second node N2. Since the diodes D1, D2, and D3 have a threshold voltage that varies in inverse proportion to an ambient temperature, the comparison voltage Vcpr also varies according to the ambient temperature. For example, assuming that the driving voltage AVDD is approximately 12 V and the threshold voltage of each of the diodes D1, D2, and D3 is approximately 0.57 V at room temperature, if the ambient temperature falls, the level of the comparison voltage Vcpr rises to approximately 2 V, which is due to an increase of a threshold voltage of the level of the comparison voltage Vcpr being approximately 1.7 V (3×0.57 V) at room temperature.

The reference voltage generator 422 may be a voltage divider. That is to say, the reference voltage generator 422 generates the reference voltage Vref derived from the driving voltage AVDD divided by a plurality of resistors R2 and R3 connected in series. The level of the reference voltage Vref is maintained at a fixed value regardless of a change of the ambient temperature, because the resistance of the resistors does not change with temperature and the driving voltage AVDD is fixed. The reference voltage Vref is not restricted to a voltage obtained by dividing the driving voltage AVDD, and may thus be any arbitrary voltage.

The amplifier 423 amplifies a difference between the comparison voltage Vcpr and the reference voltage Vref and outputs the temperature-dependent variable voltage VARV. For example, assume that the reference voltage Vref varies according to the ambient temperature between approximately 1.7 V and approximately 2 V, however, the temperature-dependent variable voltage VARV varies between approximately 0 V and approximately 12 V. The amplifier 423, which is a differential amplifier, includes two pairs of resistors R4 and R5 determining voltage gains and an operational amplifier OP. The amplifier 423 is not restricted to a differential amplifier. The temperature sensor 421 may also include a buffer 426, shown in FIG. 10, that provides the amplifier 423 with the comparison voltage Vcpr as it is. If the reference voltage Vref is obtained by dividing the driving voltage AVDD, the temperature sensor 421 may also include a buffer (not shown) that provides the amplifier 423 with the reference voltage Vref as it is.

Figure 5:
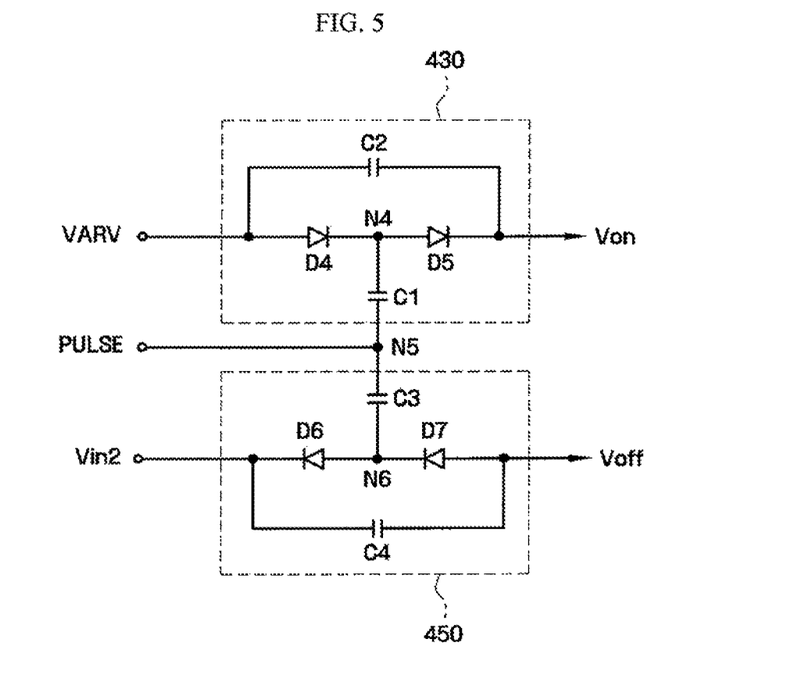
FIG. 5 is an internal circuit diagram illustrating a charge pumping unit and a gate-off voltage generator used in the device shown in FIG. 3.

The charge pumping unit 430 and the gate-off voltage generator 450 will now be described in more detail with reference to FIG. 5, which is a circuit diagram illustrating the charge pumping unit 430 and the gate-off voltage generator 450 shown in FIG. 3.

The charge pumping unit 430 includes fourth and fifth diodes D4 and D5 and first and second capacitors C1 and C2. The temperature-dependent variable voltage VARV is supplied to the anode terminal of the fourth diode D4, the cathode terminal of which is connected to a fourth node N4. The first capacitor C1 is connected between the fourth node N4 and a fifth node N5 to which the pulse signal PULSE is applied. The anode terminal of the fifth diode D5 is connected to the fourth node N4, and a gate-on voltage Von is output at the cathode terminal of the fifth diode D5. The second capacitor C2 is connected between the anode terminal of the fourth diode D4 and the cathode terminal of the fifth diode D5. While the exemplary embodiment has shown that the charge pumping unit 430 includes two diodes and two capacitors by way of example, the invention is not limited to the illustrated example and the charge pumping unit 430 may be configured by a combination of three or more diodes and three or more capacitors.

In the operation of the charge pumping unit 430, when the pulse signal PULSE is applied to the first capacitor C1, the fourth node N4 outputs a pulse of a high voltage level increased by the voltage level of the pulse signal PULSE. The fifth diode D5 and the second capacitor C2 clamp the voltage of the fourth node N4 to then output the gate-on voltage Von. In other words, the gate-on voltage Von is a DC voltage shifted from the temperature-dependent variable voltage VARV by approximately the amplitude of the pulse signal PULSE. In short, since the temperature-dependent variable voltage VARV varies in inverse proportion to temperature, the gate-on voltage Von also varies in inverse proportion to temperature.

The gate-off voltage generator 450 includes sixth and seventh diodes D6 and D7 and third and fourth capacitors C3 and C4. The second input voltage Vin2 is applied to the cathode terminal of the sixth diode D6, the anode terminal of which is connected to a sixth node N6. The third capacitor C3 is connected between the sixth node N6 and the fifth node N5 to which the pulse signal PULSE is applied. The cathode terminal of the seventh diode D7 is connected to the sixth node N6 and a gate-off voltage Voff is output to the anode terminal of the seventh diode D7. The fourth capacitor C4 is connected between the cathode terminal of the sixth diode D6 and the anode terminal of the seventh diode D7. While the exemplary embodiment has shown that the gate-off voltage generator 450 includes two diodes and two capacitors by way of example, the invention is not limited to the illustrated example and the gate-off voltage generator 450 may be configured by a combination of three or more diodes and three or more capacitors.

In the operation of the gate-off voltage generator 450, when the pulse signal PULSE is applied to the third capacitor C3, the sixth node N6 outputs a pulse of a low voltage level decreased by the voltage level of the pulse signal PULSE. The sixth diode D6 and the fourth capacitor C4 clamp the voltage of the sixth node N6 to then output a gate-off voltage Voff. In other words, the gate-off voltage Von is a DC voltage shifted from the second input voltage Vin2 by approximately the amplitude of the pulse signal PULSE. Here, the second input voltage Vin2 may be a ground voltage. If the pulse signal PULSE is not influenced by temperature, the gate-off voltage Voff may be a negative voltage and may also be not influenced by temperature.

Figure 6:
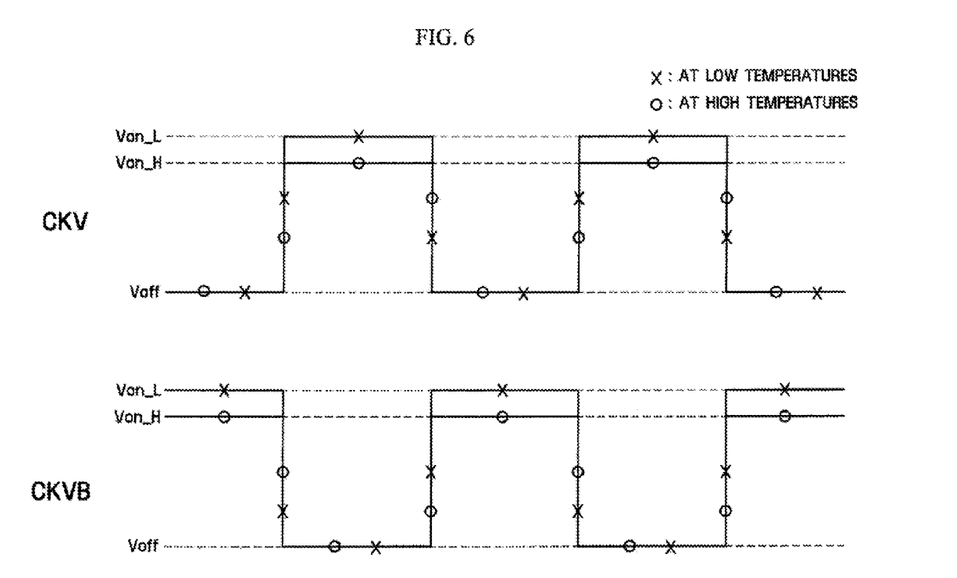
FIG. 6 is a graph for explaining the output of a switching unit shown in FIG. 3.

A clock signal CKV and a clock bar signal CKVB that are obtained using the gate-on voltage Von and the gate-off voltage Voff are illustrated in FIG. 6. That is, the clock signal CKV and the clock bar signal CKVB both swing between a gate-on voltage Von_H and the gate-off voltage Voff at high temperatures, whereas the clock signal CKV and the clock bar signal CKVB both swing between a gate-on voltage Von_L, which is higher than the Von_H, and the gate-off voltage Voff at low temperatures.

Figure 7:
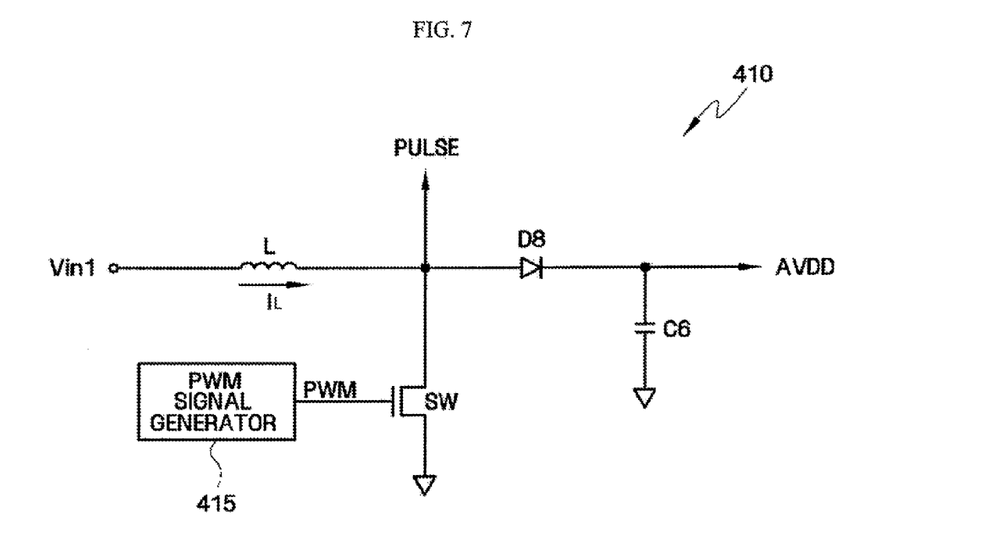
FIG. 7 is an internal circuit diagram illustrating a boost converter used in the device shown in FIG. 3.

FIG. 7 is circuit diagram illustrating the boost converter 410 used in the driving device 400 shown in FIG. 3.

Referring to FIG. 7, the boost converter 410 includes an inductor L to which the first input voltage Vin1 is applied, an eighth diode D8, the anode terminal of which is connected to the inductor L and the cathode terminal of which is connected to the output terminal of the driving voltage AVDD, a sixth capacitor C6 connected between the cathode of the eighth diode D8 and a ground terminal, a switching element SW which is connected between the anode of the eighth diode D8 and a ground terminal, and a pulse width modulation (PWM) signal generator 415 which is connected to the gate of the switching element SW.

In the operation of the boost converter 410, when the PWM signal PWM output to the PWM signal generator 415 is at a high level, the switching element SW is turned on. An end of the inductor L is connected to a ground terminal through the switching element SW, and the current $I_L$ flowing through the inductor L, which is proportional to the first input voltage Vin1 applied to opposite ends of the inductor L, increases slowly according to characteristics of the current and voltage of the inductor L.

If the PWM signal PWM output of the PWM signal generator 415 is at a low level, the switching element SW may be turned off, the current IL may flow through the inductor L via the eighth diode D8 and the sixth capacitor C6 may be charged according to characteristics of the current and voltage of the sixth capacitor C6. Accordingly, the first input voltage Vin1 is boosted to a predetermined voltage level to then be output as the driving voltage AVDD. In this exemplary embodiment, the pulse signal PULSE swings between the driving voltage AVDD and a ground voltage. That is, the driving voltage AVDD and the amplitude of the pulse signal PULSE may be not influenced by temperature.

The driving voltage AVDD may be provided to a gray voltage generator (not shown). The gray voltage generator may comprise a plurality of resistors each connected between each of nodes to which the driving voltage AVDD is applied and the ground terminal, to generate gray voltages by dividing the voltage level of the driving voltage AVDD. The internal circuit of the gray voltage generator is not limited to the stated example and various modifications and changes may be made.

The operation of the gate driver 500 in the display shown in FIG. 1 will now be described with reference to FIGS. 8 and 9.

Figure 8:
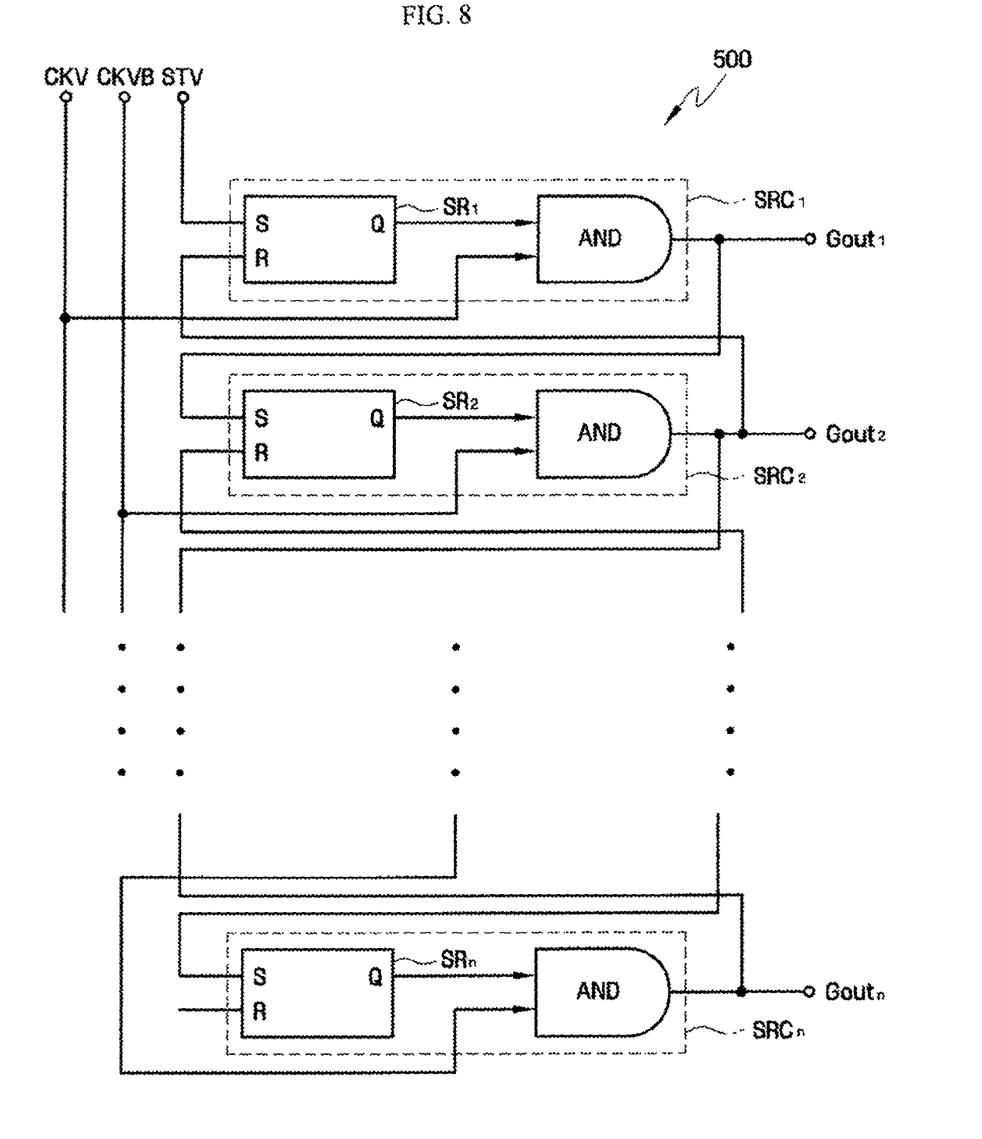
FIG. 8 is a block diagram illustrating a gate driver used in the display shown in FIG. 1.
Figure 9:
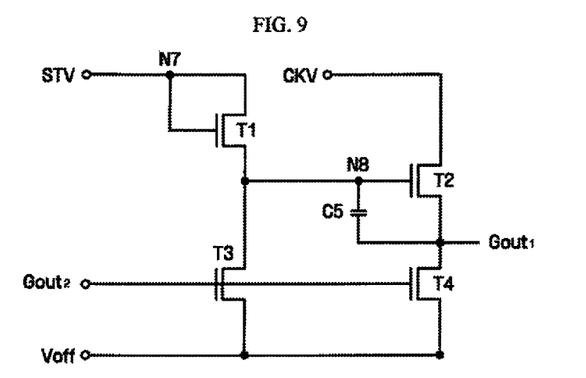
FIG. 9 is a circuit diagram illustrating a first stage of the converter shown in FIG. 6.

FIG. 8 is a block diagram illustrating the gate driver 500 shown in FIG. 1, and FIG. 9 is a circuit diagram illustrating a first stage shown in FIG. 8.

Referring to FIG. 8, the gate driver 500 includes a plurality of stages $SRC_1, \ldots, SRC_n$ that are cascade-connected to each other. More specifically, first through nth stages $SRC_1, \ldots, SRC_n$ each includes an SR latch ($SR_1$-$SR_n$) and an AND gate. In addition, the plurality of stages $SRC_1, \ldots, SRC_n$ are connected to the gate lines $G_1$-$G_n$ shown in FIG. 1, respectively.

The respective SR latches $SR_1$-$SR_n$ are set, that is, activated, by gate driving signals $Gout_1$-$Gout_n$ of a high level, which are supplied from the previous stage, and are reset, that is, deactivated, by gate driving signals $Gout_1$-$Gout_n$ of a high level, which are fed back from the next or subsequent stage. When the respective AND gate of each of the stages $SRC_1, \ldots, SRC_n$ is set and the clock signal CKV or clock bar signal CKVB of a high level is supplied to the AND gate, the gate driving signals $Gout_1$-$Gout_n$ are generated.

More specifically, the clock signal CKV is applied to each of odd numbered stages $SRC_{(2i-1)}$ (i=1, 2, . . . ), and the clock bar signal CKVB having a phase different from that of the clock signal CKV is applied to each of even numbered stages $SRC_{2j}$ (j=1, 2, . . . ). For example, the clock signal CKV and the clock bar signal CKVB can have phases opposite to each other.

Accordingly, in the AND gates of the odd numbered stages $SRC_{(2i-1)}$ (i=1, 2 . . . , n), when the SR latches $SR_{(2i-1)}$, (i=1, 2, . . . , n) are set and the clock signal CKV of a high level is supplied to the AND gates, the gate driving signals $Gout_{(2i-1)}$ (i=1, 2, . . . , n) are generated. In this way, the gate driver 500 sequentially outputs the clock signal CKV or the clock bar signal CKVB of a high level to the gate lines $G_1$-$G_n$.

Referring to FIG. 9, each of the respective stages $SRC_1, \ldots, SRC_n$ includes a plurality of transistors T1-T4 and a fifth capacitor C5. In the following description, an exemplary embodiment of the present invention will be explained with regard to the operation of the first stage $SRC_1$ by way of example.

When a vertical start signal STV of a high level is fed to a seventh node N7 and supplied to the fifth capacitor C5 via the first transistor T1, which is a diode-connected transistor, the fifth capacitor C5 is charged with a voltage. When an eighth node N8 is provided with that voltage, the second transistor T2 is turned on. In this case, when the clock signal CKV of a high level is supplied to the second transistor T2, the clock signal CKV is output as the gate driving signal $Gout_1$. The output gate driving signal $Gout_1$, which is the clock signal CKV of a high level, is a gate-on voltage Von.

In the second stage $SRC_2$, when the gate driving signal $Gout_2$ of a high level is applied to the gate terminals of the third and fourth transistors T3 and T4, the third transistor T3 is turned on to discharge the voltage charged in the fifth capacitor C5 and the fourth transistor T4 is also turned on to pull the output gate driving signal $Gout_1$ of a high level down to the voltage level of the gate-off voltage Voff. Accordingly, the output gate driving signal $Gout_1$ falls to the gate-off voltage Voff.

While the exemplary embodiment has illustrated that the first through fourth transistors T1-T4 are NMOS TFTs by way of example, the invention is not limited to the illustrated example and the first through fourth transistors T1-T4 may be PMOS TFTs made of amorphous silicon (a-Si).

The current driving capacity of the switching element Q of FIG. 2 of a pixel and the second transistor T2 made of a-Si is reduced at a temperature lower than room temperature, resulting in a deterioration of a display quality. Nevertheless, since the driving device 400 of FIG. 1 provides the clock signal CKV having an increased amplitude at a low temperature, the display quality can be enhanced and not be deteriorated.

More specifically, the gate lines $G_1$-$G_n$ shown in FIG. 1 have parasitic capacitance of several hundreds pF. If the current driving capacity of the second transistor T2 is decreased at a low temperature, the amount of charges supplied to charge parasitic capacitors of the gate lines $G_1$-$G_n$ is reduced for a predetermined time. As a result, the gate-on voltage Von for driving the switching element Q of FIG. 2 within a pixel is reduced. In such a case, the display quality may deteriorate. Meanwhile, when the ambient temperature is low, the gate-on voltage generator 440 generates a gate-on voltage of a high level and a clock signal CKV based on the gate-on voltage of a high level is supplied to the gate driver 500. Thus, a voltage difference between the source and the gate of the second transistor T2 is increased. Accordingly, since the current driving capacity of the second transistor T2 is increased and a switching element, that is, the switching element Q of FIG. 2 in a pixel is turned on in response to a high-level gate driving signal Gout1, the display quality is enhanced.

Figure 10:
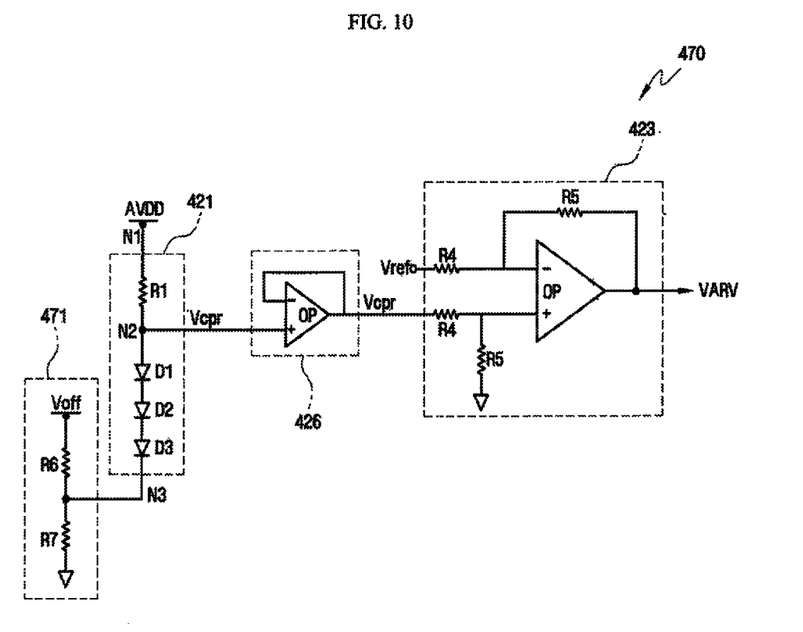
FIG. 10 is a circuit diagram illustrating a temperature sensor of a driving device according to an exemplary embodiment of the present invention.

A gate-on voltage generator, a driving device, and a display apparatus including the gate-on voltage generator and the driving device, according to an exemplary embodiment of the present invention will hereinafter be described in detail with reference to FIG. 10. FIG. 10 is a circuit diagram of a temperature sensor 470 included in a driving device according to an exemplary embodiment of the present invention. Like reference numerals refer to like elements throughout the specification and drawings, and thus, detailed descriptions thereof will be skipped.

Referring to FIG. 10, a negative voltage is applied to a third node N3 of a comparison voltage generator 421. The negative voltage may be obtained by dividing a gate-off voltage Voff. For this, the temperature sensor 470 may include a voltage divider 471 which divides a negative gate-off voltage Voff and provides a voltage obtained by the division to the third node N3.

When a negative voltage is applied to the third node N3 of the comparison voltage generator 421, the range of variation of a comparison voltage Vcpr varies. For example, the comparison voltage Vcpr may be higher than 0 V or may be a negative voltage. The voltage of the third node N3 may be varied according to the resistances of resistors R6 and R7 of the voltage divider 471.

Figure 11:
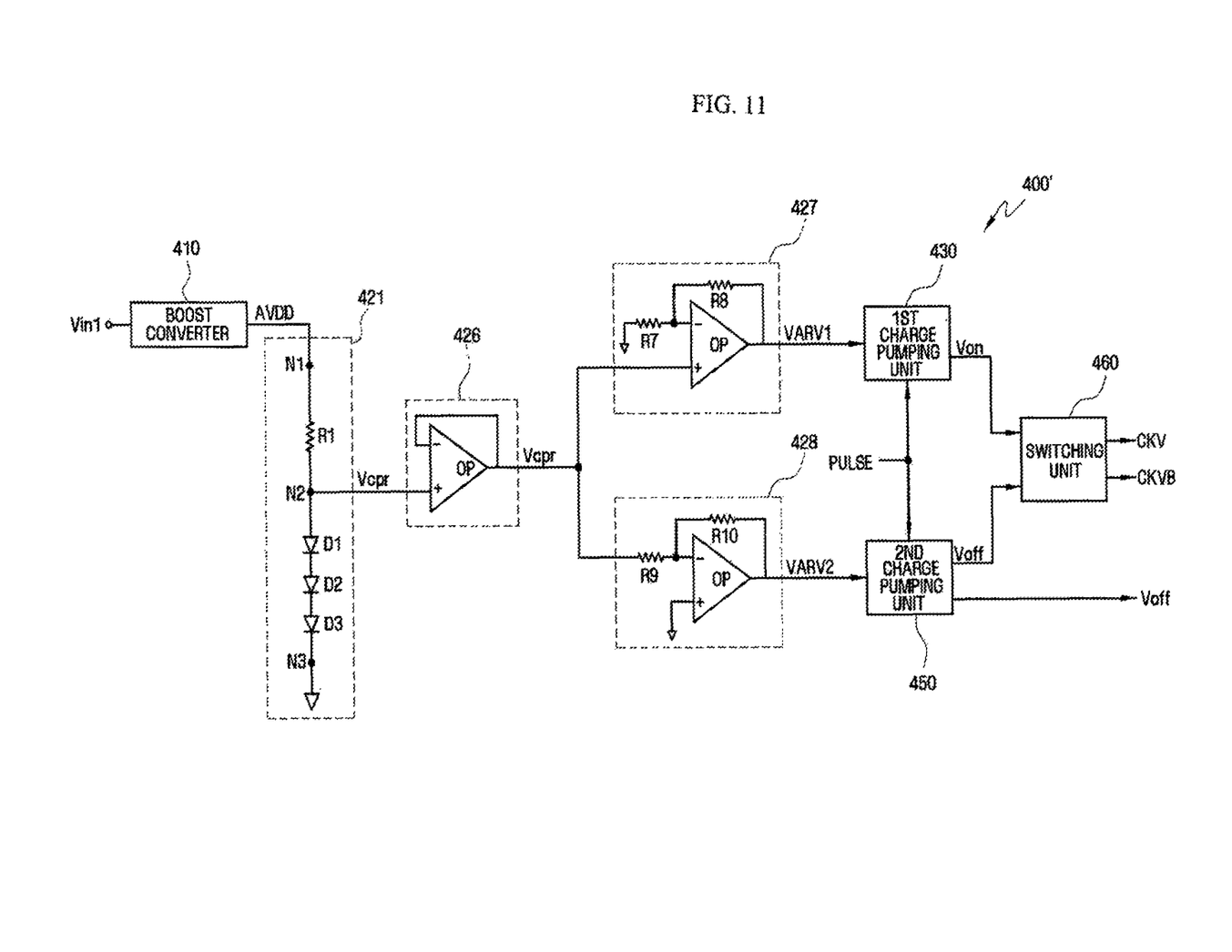
FIG. 11 is a circuit diagram of a driving device according to an exemplary embodiment of the present invention.
Figure 12:
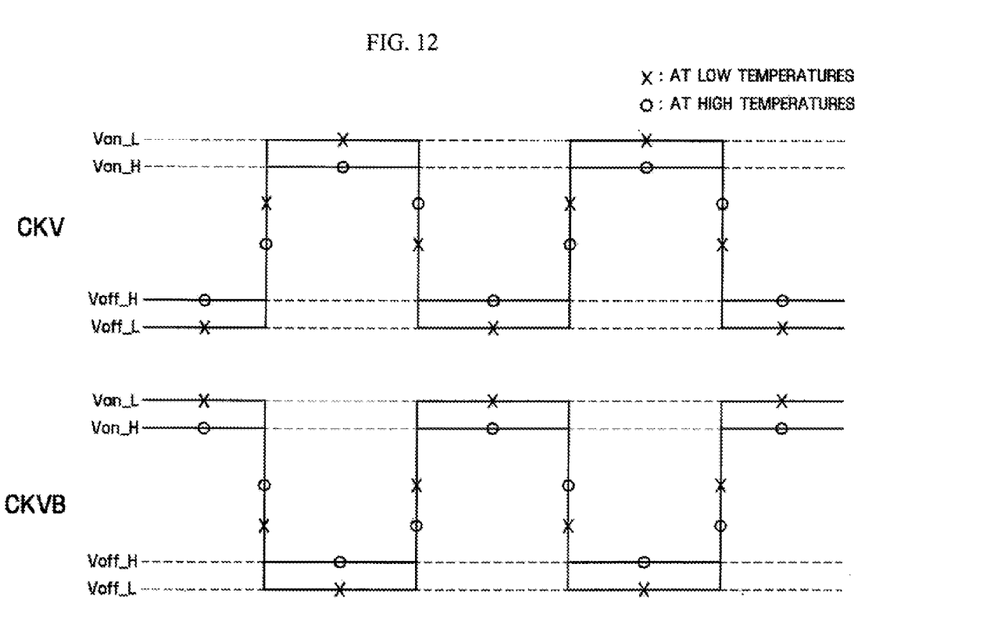
FIG. 12 is a graph for explaining the output of the driving device shown in FIG. 11.

A gate-on voltage generator, a driving device, and a display apparatus including the gate-on voltage generator and the driving device, according to embodiment of the present invention will hereinafter be described in detail with reference to FIGS. 11 and 12. FIG. 11 is a circuit diagram of a driving device 400' according to an embodiment of the present invention, and FIG. 12 is a graph for explaining output of the driving device 400' shown in FIG. 11. Like reference numerals refer to like elements throughout the specification and drawings, and thus, detailed descriptions thereof will be skipped.

In the present exemplary embodiment, unlike in the previous exemplary embodiment, a gate-off voltage Voff varies according to temperature. Thus, as temperature decreases, the amplitudes of a clock signal CKV and a clock bar signal CKVB increase.

Referring to FIG. 11, the driving device 400' includes a gate-on voltage generator, a gate-off voltage generator, and a switching unit. The gate-on voltage generator includes a first temperature sensor 421, 426, and 427 and a first charge pumping unit 430. The gate-off voltage generator includes a second temperature sensors 421, 426, and 428 and a second charge-pumping unit 450. That is, the first temperature sensor 421, 426, and 427 and the second temperature sensor 421, 426, and 428 may share the comparison voltage generator 421 and the buffer 426. A ground voltage may be applied to a third node N3 of the comparison voltage generator 421, but the present invention is not restricted to this. That is, a negative voltage obtained by dividing a gate-off voltage Voff may be applied to the third node N3 of the comparison voltage generator 421.

The first temperature sensor 421, 426, and 427 receives a comparison voltage Vcpr and outputs a first temperature-dependent variable voltage VARV1. As the temperature increases, the first temperature-dependent variable voltage VARV1 decreases. On the other hand, as the temperature decreases, the first temperature-dependent variable voltage VARV1 increases. The first temperature sensor 421, 426, and 427 may include a non-inverting amplifier 427. The non-inverting amplifier 427 receives the comparison voltage Vcpr that varies in inverse proportion to temperature and generates the first temperature-dependent variable voltage VARV1 by amplifying the comparison voltage Vcpr.

The second temperature sensor 421, 426, and 428 receives the comparison voltage Vcpr and outputs a second temperature-dependent variable voltage VARV2. As the temperature increases, the second temperature-dependent variable voltage VARV2 increases. On the other hand, as temperature decreases, the second temperature-dependent variable voltage VARV2 decreases. The second temperature sensor 421, 426, and 428 may include an inverting amplifier 428. The inverting amplifier 428 is provided with the comparison voltage Vcpr that varies in proportion to temperature and generates the second temperature-dependent variable voltage VARV2 by amplifying the comparison voltage Vcpr while inverting the phase of the comparison voltage Vcpr.

The first and second charge-pumping units 430 and 450 receive the first and second temperature-dependent variable voltages VARV1 and VARV2, respectively, and output the gate-on voltage Von and the gate-off voltage Voff, respectively, which vary according to temperature.

The switching unit 460 of FIG. 3 generates the clock signal CKV and the clock bar signal CKVB using the gate-on voltage Von and the gate-off voltage Voff. The clock signal CKV and the clock bar signal CKVB are illustrated in FIG. 12. Referring to FIG. 12, the clock signal CKV and the clock bar signal CKVB swing between a gate-on voltage Von_H and a gate-off voltage Voff_H at high temperatures, whereas the clock signal CKV and the clock bar signal CKVB swing between a gate-on voltage Von_L, which is higher than the gate-on voltage Von_H, and a gate-off voltage Voff_L, which is lower than the gate-off voltage Voff H, at low temperatures.

In short, the driving device 400' can provide the clock signal CKV and the clock bar signal CKVB whose amplitudes increase according to temperature. Therefore, a display apparatus including the driving device 400' can enhance the quality of display of images even at low temperatures.

In concluding the detailed description, those of ordinary skill in the art will appreciate that many variations and modifications can be made to the exemplary embodiments without substantially departing from the principles of the present invention. Therefore, the disclosed exemplary embodiments of the invention are used in a generic and descriptive sense only and not for purposes of limitation.

What is claimed is:

1. A driving device comprising:
   a boost converter which receives and boosts a first input voltage and outputs a driving voltage and a pulse signal, the driving voltage and an amplitude of the pulse signal being irrelevant to an ambient temperature;
   a gate-on voltage generator comprising:
      a temperature sensor provided with an operational amplifier configured to receive a driving voltage and produce a temperature-dependent variable voltage, the level of which varies according to the ambient temperature, and
      a charge pumping unit configured to shift the temperature-dependent variable voltage by the amplitude of the pulse signal and to generate a gate-on voltage;
   a gate-off voltage generator configured to shift the voltage level of a second input voltage by the amplitude of the pulse signal and to generate a gate-off voltage; and
   a switching unit generating a clock signal having a swing of a voltage difference between the gate-on voltage and the gate-off voltage.

2. The driving device of claim 1, wherein the voltage level of the temperature-dependent variable voltage increases when the ambient temperature falls, and the voltage level of the temperature-dependent variable voltage decreases when the ambient temperature rises.

3. The driving device of claim 2, wherein the operational amplifier increases a change of the temperature-dependent variable voltage according to the change of the ambient temperature.

4. The driving device of claim 2, wherein the temperature sensor comprises:
   a comparison voltage generator including one or more diodes each having a variable threshold voltage according to a change of the ambient temperature and generating a comparison voltage having a variable voltage level according to the ambient temperature; and
   an amplifier including the operational amplifier and amplifying a difference between the comparison voltage and the reference voltage.

5. The driving device of claim 4, wherein the comparison voltage generator further includes a fixed resistor connected between a first node and a second node and the diodes that are connected in series between the second node and a third node, wherein a positive voltage is applied to the first node, the comparison voltage is output via the second node, and a ground voltage is applied to the third node.

6. The driving device of claim 4, wherein the comparison voltage generator includes a fixed resistor connected between a first node and a second node and the diodes that are connected in series between the second node and a third node, wherein a positive voltage is applied to the first node, the comparison voltage is output via the second node, and a negative voltage is applied to the third node.

7. The driving device of claim 6, wherein the temperature sensor further comprises a voltage divider that divides the gate-off voltage and provides the negative voltage to the third node.

8. The driving device of claim 4, wherein the temperature sensor further comprises a buffer that provides the amplifier with the comparison voltage without alteration.

9. A driving device, comprising:
   a boost converter receiving and boosting a first input voltage and outputting a driving voltage and a pulse signal, the driving voltage and an amplitude of the pulse signal not being influenced by an ambient temperature;
   a gate-on voltage generator comprising:
      a first temperature sensor configured to output a first temperature-dependent variable voltage; and
      a first charge-pumping unit configured to shift the first temperature-dependent variable voltage by the amplitude of the pulse signal and to output a gate-on voltage, the first temperature-dependent variable voltage varying in inverse proportion to the ambient temperature;
   a gate-off voltage generator comprising:
      a second temperature sensor configured to output a second temperature-dependent variable voltage; and
      a second charge-pumping unit configured to shift the second temperature-dependent variable voltage by the amplitude of the pulse signal and to output a gate-off voltage, the second temperature-dependent variable voltage varying in proportion to the ambient temperature; and
   a switching unit which outputting a clock signal that swings between the gate-on voltage and the gate-off voltage.

10. The driving device of claim 9, wherein the first temperature sensor comprises:
    a comparison voltage generator including one or more diodes having a variable threshold voltage that varies in inverse proportion to the ambient temperature, and providing a comparison voltage that varies according to the ambient temperature; and
    a non-inverting amplifier receiving the comparison voltage and increasing a range of variation of the first temperature-dependent variable voltage according to the ambient temperature.

11. The driving device of claim 10, wherein the comparison voltage generator further includes a fixed resistor connected between a first node and a second node and the diodes that are connected in series between the third node and a third node, wherein the driving voltage is applied to the first node, the comparison voltage is output via the second node, and a negative voltage is applied to the third node.

12. The driving device of claim 10, wherein the comparison voltage generator further includes a fixed resistor connected between a first node and a second node and the diodes that are connected in series between the third node and a third node, wherein the driving voltage is applied to the first node, the comparison voltage is output via the second node, and a ground voltage is applied to the third node.

13. The driving device of claim 9, wherein the second temperature sensor comprises:
    a comparison voltage generator including one or more diodes having a variable threshold voltage that varies in inverse proportion to the ambient temperature, and providing a comparison voltage that varies according to the ambient temperature; and
    a inverting amplifier receiving the comparison voltage and increasing a range of variation of the second temperature-dependent variable voltage according to the ambient temperature.

14. A display apparatus comprising:
a driving device comprising:
- a boost converter configured to receive and boost a first input voltage and to output a driving voltage and a pulse signal, the driving voltage and an amplitude of the pulse signal not being influenced by an ambient temperature;
- a gate-on voltage generator comprising:
  - a temperature sensor configured to receive a driving voltage and to produce a temperature-dependent variable voltage, the level of which varies according to an ambient temperature; and
  - a charge pumping unit configured to shift the temperature-dependent variable voltage by an amplitude of the pulse signal and to generate a gate-on voltage;
- a gate-off voltage generator configured to shift a voltage level of a second input voltage by the amplitude of the pulse signal and to generate a gate-off voltage; and
- a switching unit configured to generate a clock signal having a swing of a voltage difference between the gate-on voltage and the gate-off voltage;
a gate driver configured to receive the clock signal and to output gate-on voltages having an amplitude that increases when the ambient temperature falls and that decreases when the ambient temperature rises consecutively;
a data driver configured to provide gray voltages corresponding to image data; and
a display panel configured to display images corresponding to the gray voltages responsive to the gate-on voltages.

15. The display apparatus of claim 14, wherein the voltage level of the temperature-dependent variable voltage increases when the ambient temperature falls, and the voltage level of the temperature-dependent variable voltage decreases when the ambient temperature rises.

16. The display apparatus of claim 14, wherein the gate driver comprises one or more stages that receive the clock signal and output the gate-on voltages, each of the stages including an a-Si thin film transistor that receives the clock signal.

17. The display apparatus of claim 14, wherein the temperature sensor comprises:
- a comparison voltage generator provided with one or more diodes each having a variable threshold voltage according to a change of the ambient temperature and generating a comparison voltage having a variable voltage level according to the ambient temperature; and
- an amplifier including an operational amplifier for amplifying a difference between the comparison voltage and the reference voltage.

18. The display apparatus of claim 17, wherein the temperature sensor further comprises a fixed resistor connected between a first node and a second node and one or more diodes that are connected in series between the second node and a third node, wherein the driving voltage is applied to the first node, the comparison voltage is output via the second node, and a ground voltage is applied to the third node.

19. The display apparatus of claim 17, wherein the temperature sensor further comprises a fixed resistor connected between a first node and a second node and one or more diodes that are connected in series between the second node and a third node, wherein the driving voltage is applied to the first node, the comparison voltage is output via the second node, and a negative voltage is applied to the third node.

20. The display apparatus of claim 19, wherein the temperature sensor further comprises a voltage divider that divides the gate-off voltage and provides the negative voltage to the third node.

21. The display apparatus of claim 17, wherein the temperature sensor further comprises a buffer that provides the amplifier with the comparison voltage without alteration.

* * * * *